US010593391B2

(12) United States Patent
Zhao et al.

(10) Patent No.: US 10,593,391 B2
(45) Date of Patent: Mar. 17, 2020

(54) REFRESH SCHEME IN A MEMORY CONTROLLER

(71) Applicant: Advanced Micro Devices, Inc., Santa Clara, CA (US)

(72) Inventors: Liang Zhao, Shanghai (CN); YuBin Yao, Shanghai (CN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/038,738

(22) Filed: Jul. 18, 2018

(65) Prior Publication Data

US 2020/0020384 A1 Jan. 16, 2020

(30) Foreign Application Priority Data

Jul. 16, 2018 (CN) .......................... 2018 1 0775044

(51) Int. Cl.
| | |
|---|---|
| G11C 11/406 | (2006.01) |
| G06F 13/18 | (2006.01) |
| G06F 13/16 | (2006.01) |
| G11C 11/4076 | (2006.01) |

(52) U.S. Cl.
CPC .... *G11C 11/40603* (2013.01); *G06F 13/1642* (2013.01); *G06F 13/18* (2013.01); *G11C 11/4076* (2013.01); *G11C 11/40618* (2013.01)

(58) Field of Classification Search
CPC ............................... G11C 7/22; G11C 11/406
USPC .............................................. 365/222, 233.5
See application file for complete search history.

(56) References Cited

U.S. PATENT DOCUMENTS

| 5,179,667 | A | * | 1/1993 | Iyer ..................... G06F 13/1605 |
| | | | | 711/105 |
| 5,557,578 | A | | 9/1996 | Kelly | |
| 5,583,823 | A | * | 12/1996 | Park ..................... G11C 11/406 |
| | | | | 365/230.03 |
| 6,233,195 | B1 | | 5/2001 | Yamazaki | |

(Continued)

OTHER PUBLICATIONS

JEDEC Standard; "Graphics Double Date Rate (GDDR6) SGRAM Standard"; JESD250; Jul. 2017; JEDEC Solid State Technology Association; 3103 North 10th Street, Suite 240S Arlington, Virginia 22201; United States; 190 pages.

(Continued)

*Primary Examiner* — Michael T Tran
(74) *Attorney, Agent, or Firm* — Polansky & Associates, P.L.L.C.; Paul J. Polansky; Rosalynn M. Smith (57) ABSTRACT

In one form, a memory controller includes a command queue, an arbiter, a refresh logic circuit, and a final arbiter. The command queue receives and stores memory access requests for a memory. The arbiter selectively picks accesses from the command queue according to a first type of accesses and a second type of accesses. The first type of accesses and the second type of accesses correspond to different page statuses of corresponding memory accesses in the memory. The refresh logic circuit generates a refresh command to a bank of the memory and provides a priority indicator with the refresh command whose value is set according to a number of pending refreshes. The final arbiter selectively orders the refresh command with respect to memory access requests of the first type accesses and the second type accesses based on the priority indicator.

34 Claims, 6 Drawing Sheets

(56) References Cited

U.S. PATENT DOCUMENTS

| | | | |
|---|---|---|---|
| 6,785,795 B1* | 8/2004 | De Perthuis | G06F 13/1605 |
| | | | 707/999.006 |
| 8,271,746 B1 | 9/2012 | Hutsell et al. | |
| 9,281,046 B2 | 3/2016 | Brandl | |
| 9,571,611 B2* | 2/2017 | Suryavanshi | H04L 51/18 |
| 9,576,637 B1 | 2/2017 | Balakrishnan | |
| 9,997,212 B1* | 6/2018 | Finkbeiner | G11C 7/1006 |
| 2001/0010066 A1 | 6/2001 | Chin et al. | |
| 2003/0005253 A1 | 1/2003 | Liao et al. | |
| 2003/0061459 A1 | 3/2003 | Aboulenein et al. | |
| 2007/0136545 A1 | 6/2007 | Kommrusch et al. | |
| 2007/0294470 A1 | 12/2007 | Van Dyke et al. | |
| 2008/0140724 A1* | 6/2008 | Flynn | G06F 3/0613 |
| 2009/0055566 A1 | 2/2009 | Reinig et al. | |
| 2009/0125671 A1* | 5/2009 | Flynn | G06F 9/52 |
| | | | 711/103 |
| 2010/0095058 A1 | 4/2010 | Proebsting | |
| 2010/0318750 A1 | 12/2010 | Eckert | |
| 2011/0246713 A1* | 10/2011 | Bains | G11C 7/22 |
| | | | 711/106 |
| 2011/0258391 A1* | 10/2011 | Atkisson | G06F 11/108 |
| | | | 711/118 |
| 2011/0276727 A1 | 11/2011 | Arntzen et al. | |
| 2012/0200549 A1* | 8/2012 | Sasaki | G09G 3/3659 |
| | | | 345/209 |
| 2012/0221774 A1* | 8/2012 | Atkisson | G06F 12/0802 |
| | | | 711/103 |
| 2013/0275656 A1* | 10/2013 | Talagala | G06F 12/0246 |
| | | | 711/103 |
| 2014/0115254 A1 | 4/2014 | Sukonik et al. | |
| 2016/0124873 A1* | 5/2016 | Xu | G06F 13/4243 |
| | | | 711/105 |
| 2017/0047110 A1* | 2/2017 | Kang | G11C 11/40615 |
| 2017/0186481 A1* | 6/2017 | Oh | G11C 11/40615 |
| 2018/0018133 A1* | 1/2018 | Balakrishnan | G06F 3/0611 |
| 2018/0018221 A1* | 1/2018 | Magro | G06F 11/1016 |
| 2018/0018291 A1* | 1/2018 | Magro | G06F 13/4068 |
| 2018/0053569 A1* | 2/2018 | Xiao | G11C 11/406 |
| 2018/0081570 A1* | 3/2018 | Abe | G06F 3/0655 |
| 2018/0182445 A1* | 6/2018 | Lee | G11C 8/04 |
| 2019/0035453 A1* | 1/2019 | Akel | G11C 11/40615 |
| 2019/0095247 A1* | 3/2019 | Shimamura | G05B 19/4145 |
| 2019/0147936 A1* | 5/2019 | Lee | G11C 11/40607 |
| | | | 714/754 |
| 2019/0221251 A1* | 7/2019 | Nakaoka | G11C 11/4087 |

OTHER PUBLICATIONS

JEDEC Standard; "High Bandwidth Memory (HBM) DRAM"; JESD235A-Revision of JESD235, Oct. 2013; Nov. 2015; JEDEC Solid State Technology Association; 3103 North 10th Street, Suite 240S Arlington, Virginia 22201; United States; 172 pages.

International Search Report; International Application No. PCT/US2019/038541; dated Oct. 7, 2019; 3 pages.

Written Opinion of the International Searching Authority; International Application No. PCT/US2019/038541; dated Oct. 7, 2019; 6 pages.

* cited by examiner

REFRESH SCHEME IN A MEMORY CONTROLLER

BACKGROUND

Computer systems typically use inexpensive and high density dynamic random-access memory (DRAM) chips for main memory. Most DRAM chips sold today are compatible with various double data rate (DDR) DRAM standards promulgated by the Joint Electron Devices Engineering Council (JEDEC). DRAM chips are not persistent memory devices. Therefore, periodic memory refresh is needed by the DRAM chips for data retention during normal operation of the computer system. Memory refresh is a background maintenance process required during operation of semiconductor DRAM. Each bit of memory data is stored as the presence or absence of an electric charge on small capacitors which form the DRAM chips. Charges on the capacitors leak away over time, and without a memory refresh, stored data will be lost. To prevent data loss, external circuitry sends commands to cause the memory to periodically read a row and rewrite the row, restoring the charges on the capacitors of the memory cells of the row to the original charge level. While refresh is occurring, the memory is not available for normal read and write operations.

Attempts have been made to mediate the effects of refresh operations on DRAM bandwidth. Known memory controllers adopt one of two processes for refreshing DRAM. In a first example the memory controller waits until no other accesses to the memory are pending, then the memory controller provides a refresh to the memory. These are called casual refreshes. In another example, when the memory controller has waited too long, and the memory is in critical need of a refresh, and the memory controller provides urgent refreshes. Each of the foregoing examples may result in memory transactions being stalled, consequently producing a penalty in memory performance.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a memory controller includes a command queue, an arbiter, a refresh logic circuit, and a final arbiter. The command queue receives and stores memory access requests for a memory. The arbiter selectively picks accesses from the command queue according to a first type of accesses and a second type of accesses. The first type of accesses and the second type of accesses correspond to different page statuses of corresponding memory accesses in the memory. The refresh logic circuit generates a refresh command to a bank of the memory. The refresh logic circuit provides a priority indicator with the refresh command whose value is set according to a number of pending refreshes. The final arbiter selectively orders the refresh command with respect to memory access requests of the first type accesses and the second type accesses. The ordering is based on the priority indicator.

In another form, a data processing system includes a memory accessing agent, a memory system, and a memory controller. The memory accessing agent provides memory access requests for a memory. The memory system is coupled to the memory accessing agent. The memory controller is coupled to the memory system and the memory accessing agent includes a command queue, an arbiter, and a final arbiter. The command queue stores memory access commands received from the memory accessing agent. The arbiter selectively picks memory accesses from the command queue according to a first type of access and a second type of access. Each type of access corresponds to a different page status of a bank in the memory. The final arbiter arbitrates based on input received from a refresh logic circuit. The refresh logic circuit generates a refresh command to the bank of the memory and provides a priority indicator to the refresh command. The value of the priority indicator is set according to a number of pending refreshes, to selectively order the refresh command with respect to a first type of access and a second type of access.

In yet another form, a method for managing refresh of a memory in a memory system via a memory controller. A plurality of memory access requests is received and stored in a command queue. The memory accesses requests are selectively picked from the command queue according to a first type of accesses and a second type of accesses. The first type of accesses and a second type of accesses correspond to different page statuses of corresponding memory accesses in the memory. A refresh command is generated to a bank of the memory. A priority indicator is provided with the refresh command. The refresh command is selectively ordered with respect to memory access requests of the first type access and the second type access based on the priority indicator.

Figure 1:
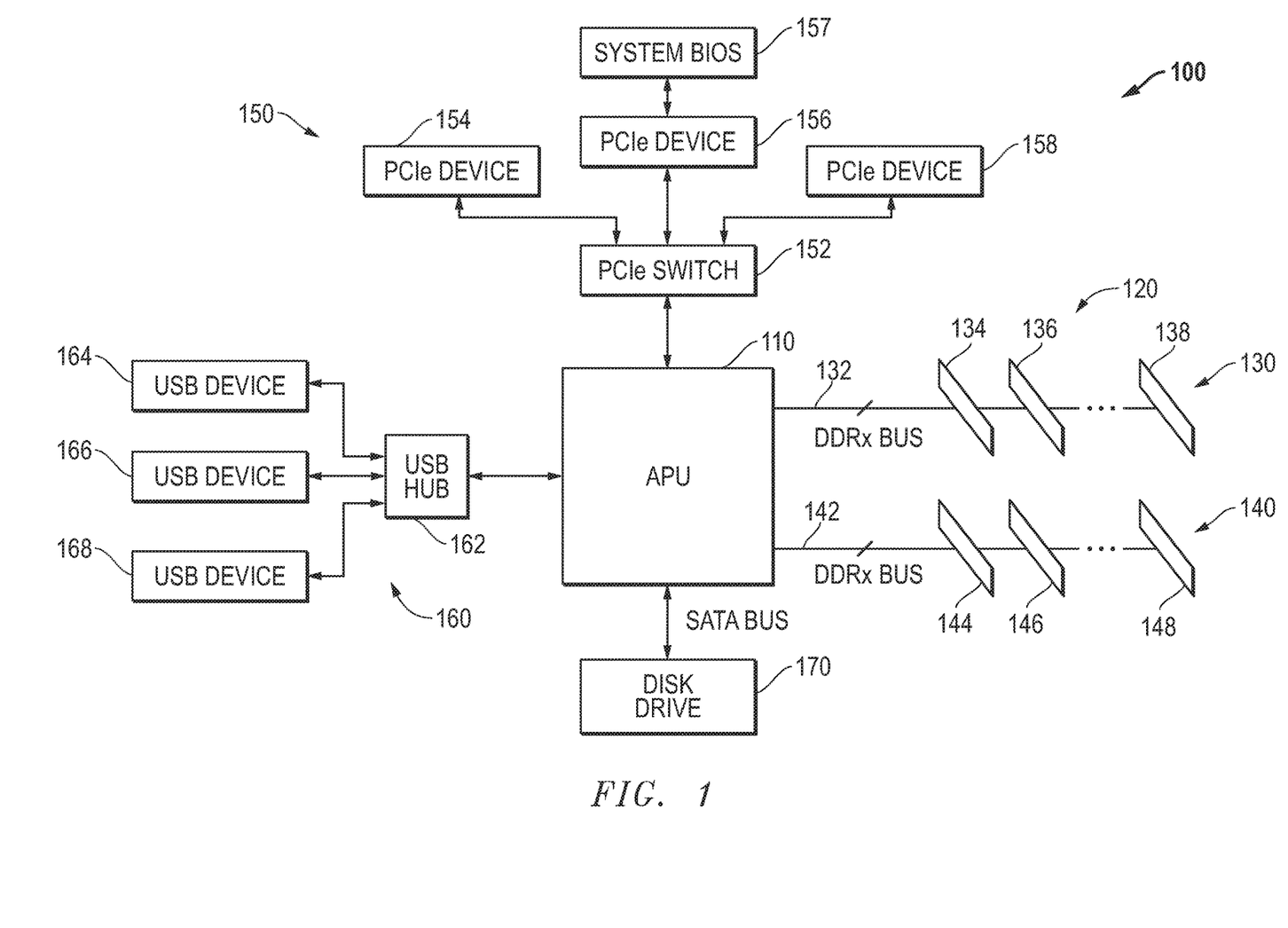
FIG. 1 illustrates in block diagram form a data processing system according to some embodiments.

FIG. 1 illustrates in block diagram form a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise, memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (GDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
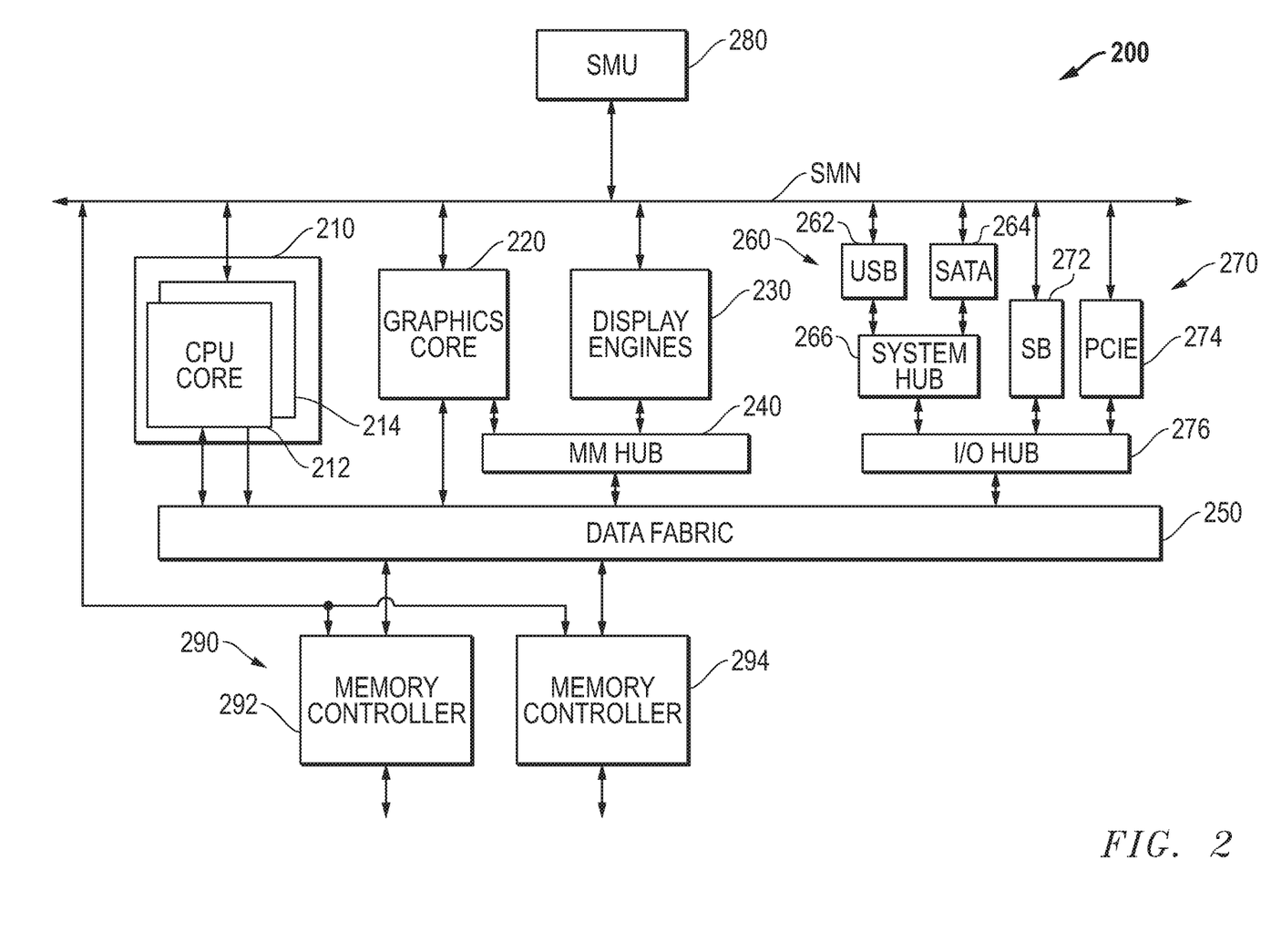
FIG. 2 illustrates in block diagram form an accelerated processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex 210 can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus, for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
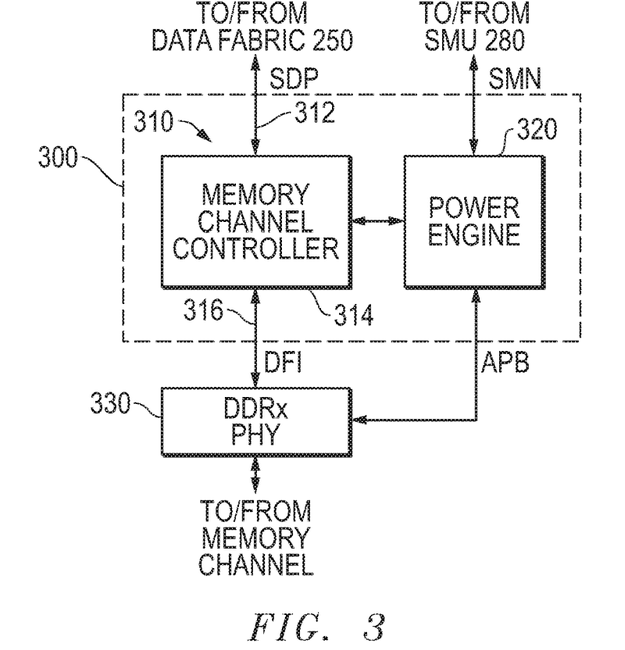
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
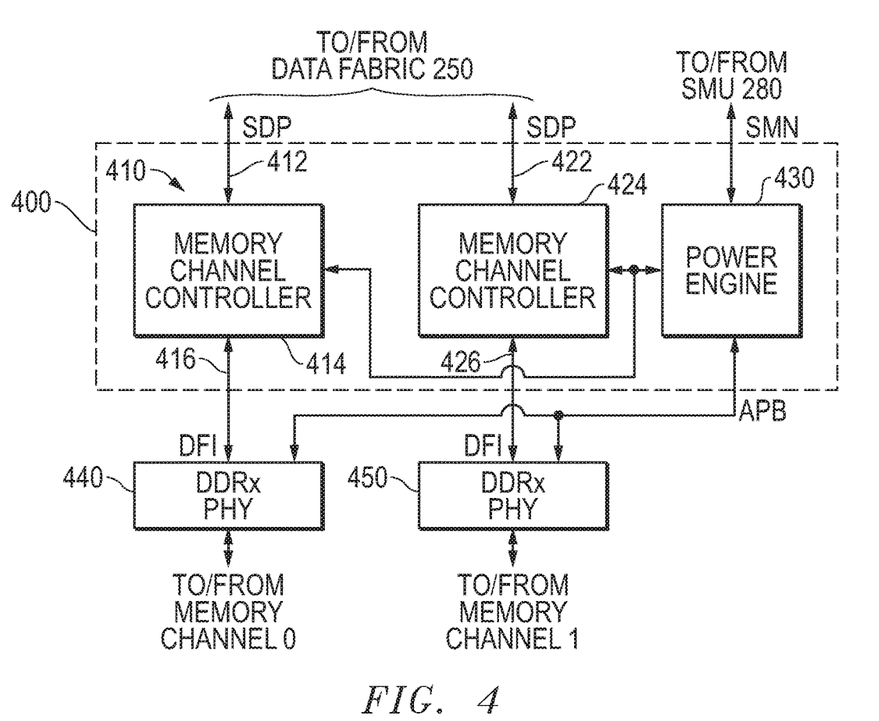
FIG. 4 illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416. Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
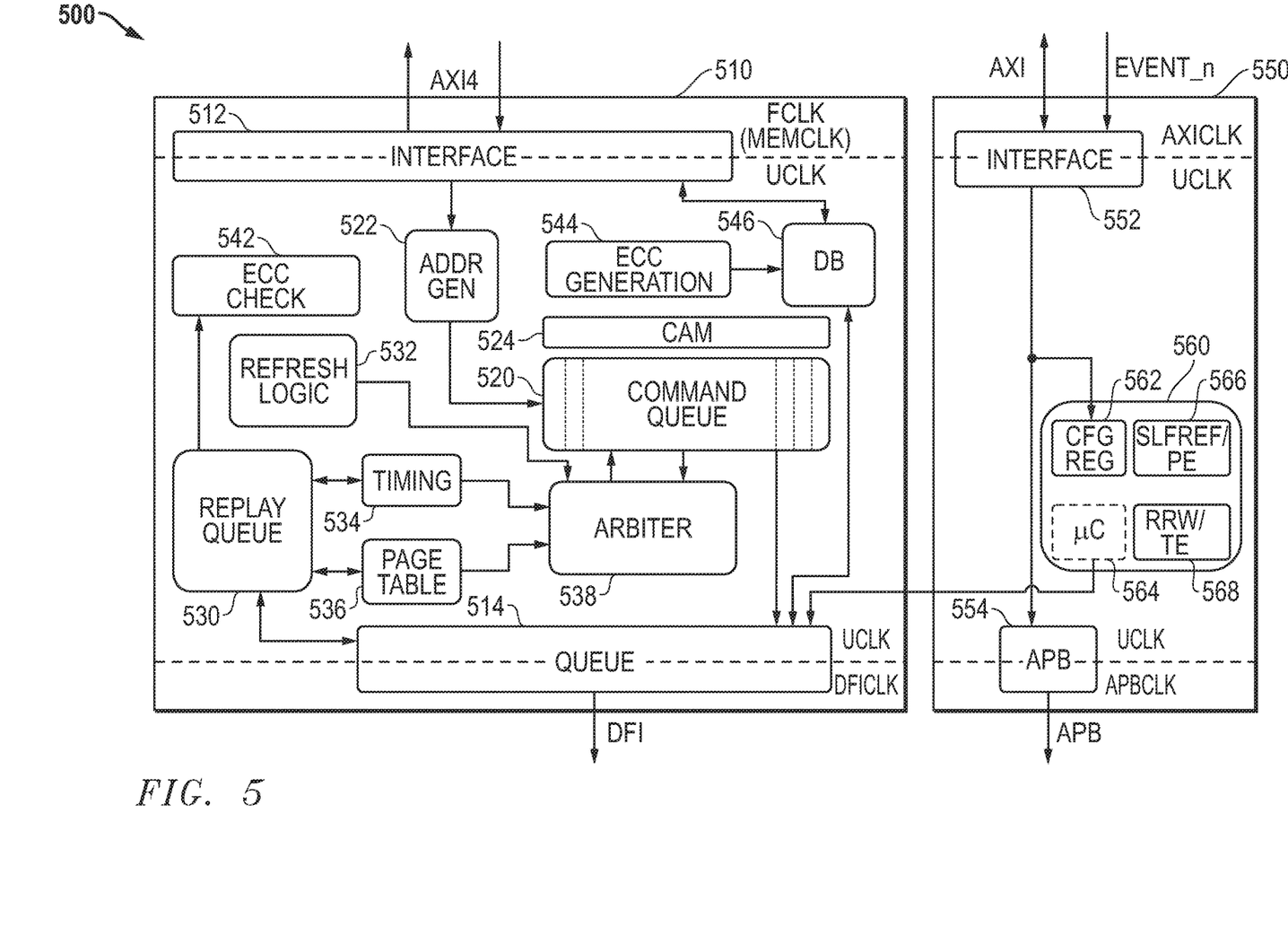
FIG. 5 illustrates in block diagram form a memory controller according to some embodiments.

FIG. 5 illustrates in block diagram form a memory controller 500 according to some embodiments. Memory controller 500 includes a memory channel controller 510 and a power controller 550. Memory channel controller 510 includes an interface 512, a queue 514, a command queue 520, an address generator 522, a content addressable memory (CAM) 524, a replay queue 530, a refresh logic circuit block 532, a timing block 534, a page table 536, an arbiter 538, an error correction code (ECC) check block 542, an ECC generation block 544, and a data buffer (DB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented as a normalized address. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for GDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic circuit 532 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic circuit 532 generates auto-refresh commands periodically to prevent data errors caused by leaking of charge off storage capacitors of memory cells in DRAM chips. In addition, refresh logic circuit 532 periodically calibrates ZQ to prevent mismatch in on-die termination resistance due to thermal changes in the system. Refresh logic circuit 532 also decides when to put DRAM devices in different power down modes.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands to the same bank, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, and an output connected to an input of queue 514. Power engine 560 includes a set of configuration registers 562, a microcontroller (μC) 564, a self refresh controller (SLFREF/PE) 566, and a reliable read/write training engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic circuit 532. Reliable read/write training engine 568 provides a continuous memory access stream to memory or I/O devices for such purposes as DDR interface read latency training and loopback testing.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 may decide to keeps pages open in different banks until they are required to be precharged prior to selecting a different page.

Figure 6:
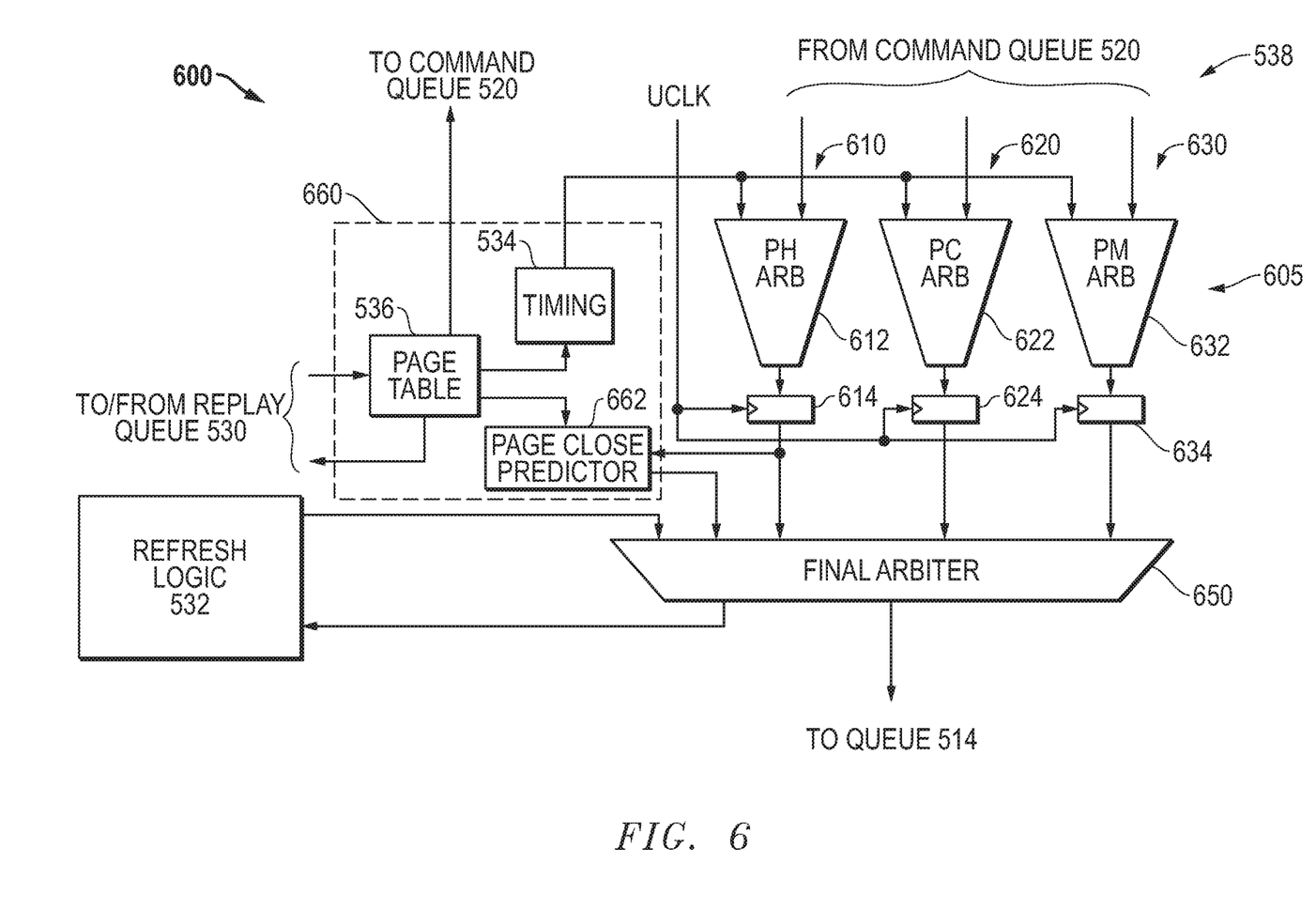
FIG. 6 illustrates a block diagram of a portion of memory controller according to some embodiments.

FIG. 6 illustrates a block diagram of a portion 600 of memory controller 500 of FIG. 5 according to some embodiments. Portion 600 includes arbiter 538, refresh logic circuit 532, and a set of control circuits 660 associated with the operation of arbiter 538. Arbiter 538 includes a set of sub-arbiters 605 and a final arbiter 650. Sub-arbiters 605 include a sub-arbiter 610, a sub-arbiter 620, and a sub-arbiter 630. Sub-arbiter 610 includes a page hit arbiter 612 labeled "PH ARB", and an output register 614. Page hit arbiter 612 has a first input connected to command queue 520, a second input, and an output. Register 614 has a data input connected to the output of page hit arbiter 612, a clock input for receiving the UCLK signal, and an output. Sub-arbiter 620 includes a page conflict arbiter 622 labeled "PC ARB", and an output register 624. Page conflict arbiter 622 has a first input connected to command queue 520, a second input, and an output. Register 624 has a data input connected to the output of page conflict arbiter 622, a clock input for receiving the UCLK signal, and an output. Sub-arbiter 630 includes a page miss arbiter 632 labeled "PM ARB", and an output register 634. Page miss arbiter 632 has a first input connected to command queue 520, a second input, and an output. Register 634 has a data input connected to the output of page miss arbiter 632, a clock input for receiving the UCLK signal, and an output. Final arbiter 650 has a first input connected to the output of page close predictor 662, a second input connected to the output of refresh logic circuit 532, a third input connected to the output of output register 614, a fourth input connected to the output of output register 624, a fifth input connected to the output of register 634, and a first output for providing an arbitration winner to queue 514.

The output of refresh logic circuit 532 provides a priority indicator with an associated refresh command. Refresh logic circuit 532 also has an input connected to the output of final arbiter 650.

Control circuits 660 include timing block 534 and page table 536 as previously described with respect to FIG. 5, and a page close predictor 662. Timing block 534 has an input and an output connected to the first inputs of page hit arbiter 612, page conflict arbiter 622, and page miss arbiter 632. Page table 536 has an input connected to an output of replay queue 530, an output connected to an input of replay queue 530, an output connected to the input of command queue 520, an output connected to the input of timing block 534, and an output connected to the input of page close predictor 662. Page close predictor 662 has an input connected to one output of page table 536, an input connected to the output of output register 614, and an output connected to the second input of final arbiter 650.

In operation, arbiter 538 selects memory access requests (commands) from command queue 520 and refresh logic 532 by taking into account the page status of each entry and the priority of each refresh command. The memory access priority is based on the intermediate refresh interval, but can be altered based on the page status of the memory access request and on a priority indicator status of the refresh command. Arbiter 538 includes three sub-arbiters that operate in parallel with refresh logic circuit 532 to address the mismatch between the processing and transmission limits of existing integrated circuit technology. The winners of the respective sub-arbitrations are presented to final arbiter 650 along with a refresh command having a priority indicator. Final arbiter 650 selects between these three sub-arbitration winners and a refresh operation from refresh logic 532 to output to queue 514.

Each of page hit arbiter 612, page conflict arbiter 622, and page miss arbiter 632 has an input connected to the output of timing block 534 to determine timing eligibility of commands in command queue 520 that fall into these respective categories. Timing block 534 includes an array of binary counters that count durations related to the particular operations for each bank in each rank. The number of timers needed to determine the status depends on the timing parameter, the number of banks for the given memory type, and the number of ranks supported by the system on a given memory channel. The number of timing parameters that are implemented in turn depends on the type of memory implemented in the system. For example, GDDR5 memories require more timers to comply with more timing parameters than other DDRx memory types. By including an array of generic timers implemented as binary counters, timing block 534 can be scaled and reused for different memory types.

A page hit is a read or write cycle to an open page. Page hit arbiter 612 arbitrates between accesses in command queue 520 to open pages. A page conflict is an access to one row in a bank when another row in the bank is currently activated. Page conflict arbiter 622 arbitrates between accesses in command queue 520 to pages that conflict with the page that is currently open in the corresponding bank and rank. Page conflict arbiter 622 selects a sub-arbitration winner that causes the issuance of a precharge command. A page miss is an access to a bank that is in the precharged state. Page miss arbiter 632 arbitrates between accesses in command queue 520 to precharged memory banks. Arbiter 538 selectively picks accesses from command queue 520 according to the type of memory access. Each of page hit arbiter 612, page conflict arbiter 622, and page miss arbiter 632 outputs a first type of accesses or a second type of accesses.

The first type of accesses and the second type of accesses correspond to different page statuses of corresponding memory accesses in the memory. More specifically, page hit arbiter 612 outputs a first type access. Page conflict arbiter 622 and page miss arbiter 632 each output a second type access. After determining the relative priority among the three sub-arbitration winners, final arbiter 650 then determines whether the sub-arbitration winners conflict with the refresh command (i.e. whether they are directed to the same bank and rank). When there are no such conflicts and the refresh time interval is met, then final arbiter 650 selects the refresh command. When there are conflicts, then final arbiter 650 complies with the following rules. When the priority indicator for the refresh command is a first priority status (intermediate priority) and page hit arbiter 612 selects a pending page hit, then final arbiter 650 selects the access indicated by page hit arbiter 612. When the priority indicator for the refresh command is a second priority status (urgent priority) and the sub-arbitration winner is from page hit arbiter 612, final arbiter 650 selects the access indicated by refresh logic circuit 532, thereby prioritizing the refresh command to execute instead of the page hit. In some cases refresh logic circuit 532 elevates the priority status of the refresh command to an urgent status, based on an urgent refresh count threshold.

Refresh logic circuit 532 provides a priority indicator with the refresh command to specify a priority status of the refresh command to final arbiter 650. Refresh logic circuit 532 sets the value of the priority indicator according to a number of pending refreshes. Refresh logic circuit 532 assigns to the priority indicator a first priority status or a second priority status. Refresh logic 532 evenly spreads out a per bank refresh cycle based on a predetermined time period. The predetermined time period is an intermediate refresh interval that is a timing dependent refresh interval, that is based on refresh time interval (tREFI) and the number of memory banks that are assigned to the memory controller. The trigger of the intermediate refresh is dependent on a threshold of owed refreshes.

Within refresh logic circuit 532, priority is initially set based on the number of pending refreshes. In general, refresh logic circuit 532 elevates the refresh command to execute between the first type of accesses and the second type of accesses. More specifically, final arbiter 650 sends the refresh command when there is no page hit transaction to the target memory banks. In response to the second priority status, final arbiter 650 elevates the refresh command above the first type of accesses and the second type of accesses. Thereby, in some cases, final arbiter 650 prioritizes the refresh command to execute instead of pending requests to the memory bank.

By using sub-arbiters for page hits, page conflicts, and page misses, arbiter 538 can selectively pick accesses based on sub-arbitrations, and categorize them as a first type of access and a second type of access. Final arbiter 650 can select refresh commands based on input received from refresh logic circuit 532 which generates the refresh command to bank 134 of memory 132 based on the number of pending refreshes. Final arbiter 650 orders the refresh command with respect to a first type of access and a second type of access. The intermediate refresh time interval is a time period that is less than tREFI. Ordering the refresh commands based on the types of memory accesses and according to the number of pending refreshes allows refresh commands to be sent at a higher frequency than the refresh time interval and in a sufficient amount of time to avoid penalties due to urgent refreshes.

In other embodiments, arbiter 538 could include a different number of sub-arbiters. For example, arbiter 538 could include two sub-arbiters, one arbiter for page hits and another arbiter for page conflicts and page misses. In this case, arbiter 538 is able to access page types based on the two sub-arbitrations.

In some embodiments, refresh logic circuit 532 generates the refresh command per bank in one tREFI so that during high workloads when some banks are refreshing, other transactions are utilizing other banks with memory 132 to more fully take advantage of bus bandwidth of memory 132. In general, to send out the intermediate refresh command during transactions final arbiter 650 asserts an urgent refresh status to the intermediate refresh command having a first or second priority status when a predetermined clock cycle expires and the page of the bank is closed. This allows the intermediate refresh per bank command to be generated to memory 132 evenly and consistently. Final arbiter 650 arbitrates an intermediate refresh per bank command to generate to the bank between page hits and page misses. Elevating the priority of the intermediate refresh per bank command to generate between page hits and page misses further saves memory 132 from penalties that derive from closing the pages. Advantageously, intermediate refresh per bank command alleviates the clock cycles required between opening a row of memory and accessing columns within the row ($t_{rcd}$), and alleviates the clock cycles required between issuing the precharge command and opening the next row ($t_{rp}$).

In some embodiments, the arbiter 538 relegates the priority of the memory banks using a priority indicator. In response to simultaneously receiving a refresh command to at least two memory banks with an equivalent priority indicator, arbiter 538 relegates the memory bank that is a most recent recipient of the refresh command below the bank of memory that is the least recent recipient of the refresh command. In response to receiving an urgent refresh command from refresh logic circuit 532, arbiter 538 blocks the activation of a row of the corresponding bank so that no new activity is started in the bank. After receiving an urgent refresh command for the bank, arbiter 538 sends the refresh request to the bank in two conditions. First, arbiter 538 sends the urgent refresh command to the bank right away if the refresh timing was met at the same time as the urgent refresh command was generated. Second, if the refresh timing was not met at the same time that the urgent refresh command was generated, arbiter 538 waits for the refresh timing to be met, and then sends a refresh request to the corresponding bank.

Figure 7:
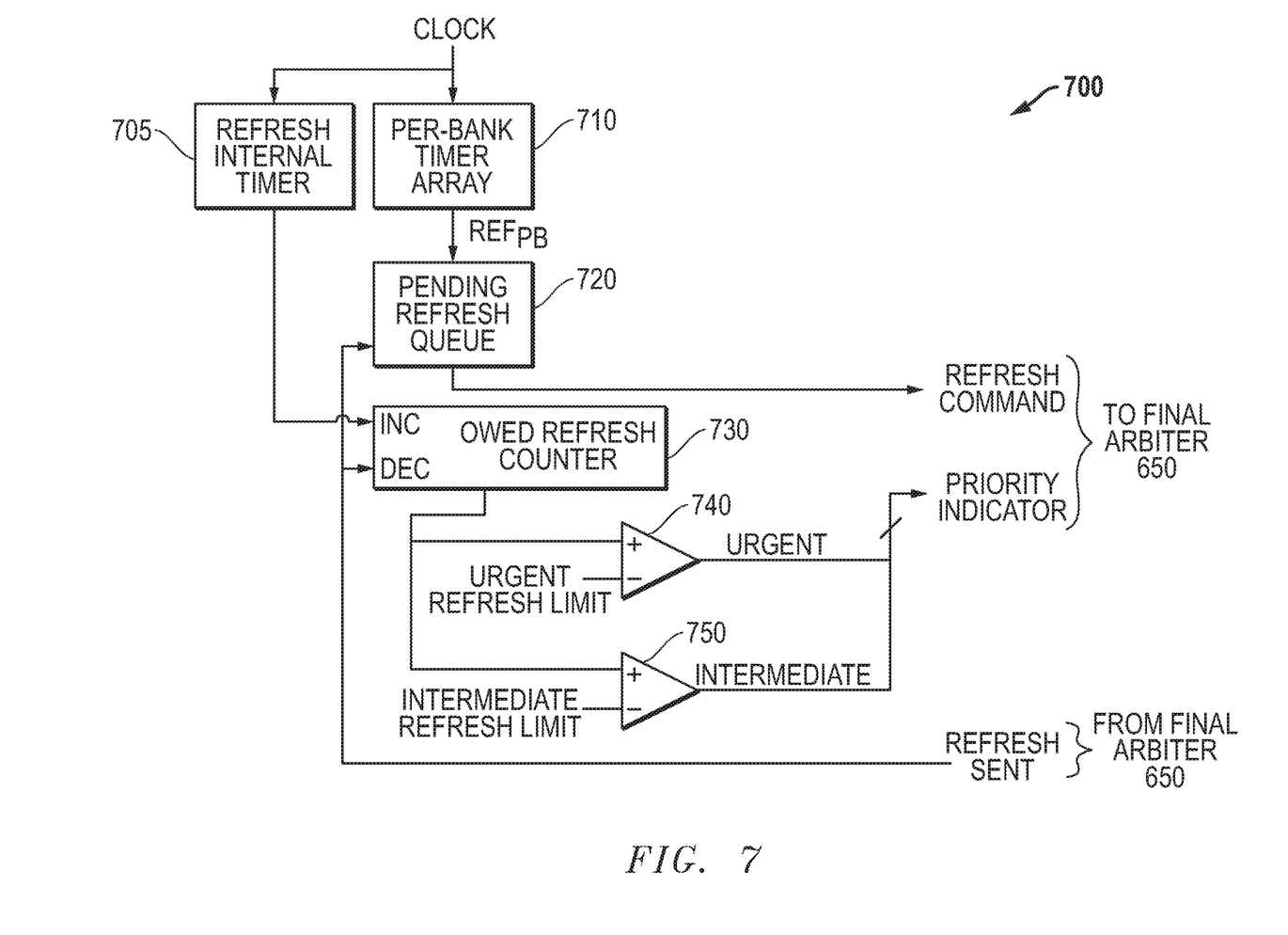
FIG. 7 illustrates a block diagram of a refresh logic circuit that may be used for the refresh logic circuit of FIGS. 5 and 6 according to some embodiments.

FIG. 7 illustrates a block diagram of a refresh logic circuit 700 that may be used for refresh logic circuit 532 of FIGS. 5 and 6 according to some embodiments. Refresh logic circuit 700 includes generally a refresh internal timer 705, a per-bank timer array 710, a pending refresh queue 720, an owed refresh counter 730, a first comparator 740, and a second comparator 750.

Refresh internal timer 705 has an input connected to a clock source and an output for providing an incremental count to owed refresh counter 730. Per-bank timer array 710 has an input for receiving a clock signal, and an output for providing a per-bank refresh to pending refresh queue 720. Pending refresh queue 720 has a first input connected to per-bank timer array 710, a second input, and an output for providing the refresh command to final arbiter 650. Owed refresh counter 730 has a first input labeled "INC", a second input labeled "DEC" connected to the output of final arbiter 650, and an output. The output of owed refresh counter 730 provides an owed refresh count to first comparator 740 and second comparator 750. First comparator 740 also includes a second input for receiving a programmable urgent refresh limit, and an output for providing a priority indicator to the refresh command. Second comparator 750 also includes a second input for receiving a programmable intermediate refresh limit, and an output labeled "URGENT" for providing a priority indicator to final arbiter 650 with the refresh command signal. Final arbiter 650 provides a "refresh sent" signal to pending refresh queue 720 and owed refresh counter 730 to track the number of pending refreshes.

In operation, refresh logic circuit 700 receives a clock signal for tracking tREFI. Refresh logic circuit 700 determines the intermediate refresh time interval based on tREFI and provides a refresh command based on the clock signal and the total number of banks assigned to the memory controller. Each cycle an intermediate time period elapses without a refresh sent, refresh timer interval timer 705 signals to increment owed refresh counter 730. Per-bank timer array 710 receives the clock signal and provides a refresh command to pending refresh queue 720 that corresponds to a respective memory bank. Pending refresh queue 720 provides the refresh command and priority indicator to final arbiter 650. Refresh logic circuit 700 sets the value of the priority indicator according to a number of pending refreshes. First comparator 740 compares the number of owed refreshes to the urgent refresh limit and elevates the priority indicator for a pending refresh command when owed refresh counter 730 is above the urgent refresh limit. Second comparator 750 compares the number of owed refreshes to the intermediate refresh limit and sets the priority indicator to a first priority status when owed refresh counter 730 is above an intermediate refresh count threshold.

In some embodiments, refresh logic circuit 700 generates per two bank refresh commands. Refresh logic circuit 700 elevates a priority indicator for a pending refresh command for the paired bank when the priority indicator is a first priority status and a refresh timer is above a refresh timing interval. Accordingly, when one of the paired banks are page closed and the intermediate refresh interval has elapsed, the priority indicator is elevated to urgent refresh status for both paired banks. In response to pages being open in the target banks, final arbiter 650 precharges both banks.

By selecting indicating intermediate priority for per-bank refresh commands, refresh logic circuit 700 allows arbiter 538 to send most refreshes in time to avoid latency penalties due to urgent refreshes. Further, memory bandwidth is increased thereby enabling improved processor performance. In one example memory bandwidth utilization is increased by approximately 3% for double data rate type six synchronous graphics random-access memory (GDDR6) when intermediate refresh per bank is used in comparison to when only a casual or urgent refresh per bank scheme is utilized.

The circuits of FIGS. 5, 6, and 7 may be implemented with various combinations of hardware and software. For example, the hardware circuitry may include priority encoders, finite state machines, programmable logic arrays (PLAs), and the like, arbiter 538 could be implemented with a microcontroller executing stored program instructions to evaluate the relative timing eligibility of the pending commands. In this case some of the instructions may be stored in a non-transitory computer memory or computer readable storage medium for execution by the microcontroller. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

APU 110 of FIG. 1 or memory controller 500 of FIG. 5 or any portions thereof, such as arbiter 538, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory controller 500 and/or arbiter 538 may vary in different embodiments. Memory controller 500 may interface to other types of memory besides DDRx memory, such as high bandwidth memory (HBM), RAMbus DRAM (RDRAM), synchronous graphics random access memory and the like. While the illustrated embodiment showed each bank of memory corresponding to intermediate refresh per bank time intervals, in other embodiments both banks of a paired bank of memory can support responding to an intermediate refresh per bank time interval.

Accordingly, it is intended by the appended claims to cover all modifications of the disclosed embodiments that fall within the scope of the disclosed embodiments.

What is claimed is:

1. A memory controller, comprising:
   a command queue for receiving and storing memory access requests for a memory;
   an arbiter for selectively picking accesses from the command queue according to a first type of accesses and a second type of accesses, wherein the first type of accesses and the second type of accesses correspond to different page statuses of corresponding memory accesses in the memory;
   a refresh logic circuit for generating a refresh command to a bank of the memory, and providing a priority indicator with the refresh command whose value is set according to a number of pending refreshes, wherein the refresh logic circuit assigns the priority indicator one of a first priority status and a second priority status; and
   a final arbiter for selectively ordering the refresh command with respect to memory access requests of the first type accesses and the second type accesses based on the priority indicator, wherein the final arbiter elevates the refresh command between the first type of accesses and the second type of accesses in response to the first priority status.

2. The memory controller of claim 1, wherein the final arbiter further elevates the refresh command above the first type of accesses and the second type of accesses in response to the second priority status.

3. The memory controller of claim 1, wherein the refresh logic circuit comprises:
   a refresh counter that counts a number of pending per bank refreshes; and
   a comparator coupled to the refresh counter that provides the first priority status to the refresh command if the refresh counter exceeds a predetermined threshold.

4. The memory controller of claim 3, wherein, based on a periodic period of time, the refresh logic circuit further elevates the priority indicator for a pending refresh command when the refresh counter is between a lower threshold and an upper threshold.

5. The memory controller of claim 4, wherein the periodic period of time is a derivative of a predetermined refresh interval and a total number of banks assigned to the memory controller.

6. The memory controller of claim 1, wherein the refresh logic circuit further assigns the priority indicator based on a programmable counter, and the programmable counter tracks a number of pending refresh commands.

7. The memory controller of claim 6, wherein the refresh logic circuit further elevates the priority indicator for a pending refresh command when the programmable counter is above an urgent refresh count threshold.

8. The memory controller of claim 1, wherein the first type accesses is not a page hit and the second type accesses is a page hit.

9. The memory controller of claim 1, wherein the arbiter comprises a plurality of sub-arbiters for selectively picking accesses based on sub-arbitrations, wherein one sub-arbitration is a page hit and each other sub-arbitration is not a page hit.

10. The memory controller of claim 1, wherein in response to simultaneously receiving a priority indicator for more than one bank, the final arbiter relegates the priority indicator of the bank of the memory that is a most recent recipient of the refresh command below the bank of the memory that is a least recent recipient of the refresh command.

11. The memory controller of claim 1, wherein the memory controller is adapted to interface to synchronous graphics random access memory capable of supporting per two-bank refresh.

12. The memory controller of claim 11, wherein the refresh logic circuit further elevates a priority indicator for a pending refresh command for a paired bank when the priority indicator is a first priority status and a refresh timer is above a refresh timing interval.

13. The memory controller of claim 12, wherein the refresh logic circuit further elevates the priority indicator for a pending refresh command to a second priority status for the paired bank when a programmable counter is above an urgent refresh count threshold and both banks of the paired bank have a first type access.

14. A data processing system, comprising:
    a memory accessing agent for providing memory access requests for a memory;
    a memory system coupled to the memory accessing agent; and
    a memory controller coupled to the memory system and the memory accessing agent, the memory controller comprising:
       a command queue for storing memory access commands received from the memory accessing agent;
       an arbiter for selectively picking memory accesses from the command queue according to a first type of access and a second type of access, wherein each type of access corresponds to a different page status of a bank in the memory; and
       a final arbiter that arbitrates based on input received from a refresh logic circuit that generates a refresh command to the bank of the memory and provides a priority indicator with the refresh command, whose value is set according to a number of pending refreshes, to selectively order the refresh command with respect to a first type of access and a second type of access,
       wherein the memory controller assigns the priority indicator one of a first priority status and a second priority status, and elevates the refresh command between the first type of access and the second type of access in response to the first priority status.

15. The data processing system of claim 14, wherein:
    the memory controller further assigns the priority indicator the first priority status based, in part, on a clock;
    the clock is for tracking a refresh interval; and
    the memory controller determines an intermediate refresh time interval based on a refresh time interval and a total number of banks assigned to the memory controller.

16. The data processing system of claim 15, wherein the intermediate refresh time interval is a period of time that is less than the refresh time interval.

17. The data processing system of claim 15, wherein in response to the intermediate refresh time interval, the memory controller generates the refresh command to the bank at a higher frequency than the refresh interval.

18. The data processing system of claim 14, wherein the memory controller further:
    assigns the priority indicator based on a predetermined threshold of a refresh counter, wherein the refresh counter counts a number of pending per bank refreshes in the memory; and
    elevates the priority indicator for a pending refresh command, based on a periodic time cycle, when the refresh counter is between a lower threshold and an upper threshold.

19. The data processing system of claim 14, wherein the memory controller further assigns the priority indicator a second priority status based on a programmable counter.

20. The data processing system of claim 19, wherein the memory controller elevates the priority indicator of the refresh command above the first type of access and the second type of access in response to the second priority status.

21. The data processing system of claim 19, wherein the memory controller blocks a corresponding bank of memory from opening in response to assertion of the second priority status.

22. The data processing system of claim 14, wherein the arbiter comprises a plurality of sub-arbiters, and the plurality of sub-arbiters are for selectively picking accesses based on sub-arbitrations, wherein one sub-arbitration is a page hit and each other sub-arbitration is not a page hit.

23. The data processing system of claim 14, wherein the memory accessing agent comprises:
   a central processing unit core;
   a graphics processing unit core; and
   a data fabric for interconnecting the central processing unit core and the graphics processing unit core to the memory controller.

24. The data processing system of claim 14, wherein the memory is a high bandwidth memory.

25. A method for managing refresh of a memory in a memory system via a memory controller, the method comprising:
   receiving a plurality of memory access requests;
   storing the plurality of memory access requests in a command queue; and
   selectively picking memory accesses requests from the command queue according to a first type of accesses and a second type of accesses that correspond to different page statuses of corresponding memory accesses in the memory;
   generating a refresh command to a bank of the memory, and providing a priority indicator with the refresh command whose value is set according to a number of pending refreshes, wherein providing the priority indicator to the refresh command further comprises assigning the priority indicator one of a first priority status and a second priority status, and elevating the refresh command between the first type accesses and the second type accesses in response to the first priority status; and
   selectively ordering the refresh command with respect to memory access requests of the first type of accesses and the second type of accesses based on the priority indicator.

26. The method of claim 25, wherein providing the priority indicator to the refresh command further comprises:
   elevating the refresh command above the first type accesses and the second type of accesses in response to the second priority status.

27. The method of claim 25, further comprising assigning the priority indicator based on a predetermined threshold of a refresh counter, wherein the refresh counter counts a number of pending per bank refreshes in the memory.

28. The method of claim 27, further comprising elevating the priority indicator for a pending refresh command, based on a periodic period of time, when the refresh counter is between a lower threshold and an upper threshold.

29. The method of claim 28, wherein the periodic period of time is a derivative of a predetermined refresh interval and a total number of banks assigned to the memory controller.

30. The method of claim 25, further comprising assigning the priority indicator based on a programmable counter, and the programmable counter tracks a number of refresh commands that are scheduled and incomplete.

31. The method of claim 30, further comprising elevating the priority indicator for a pending refresh command when the programmable counter is above an urgent refresh count threshold.

32. The method of claim 25, wherein the first type accesses is not a page hit and the second type of accesses is a page hit.

33. The method of claim 25, further comprising selectively picking accesses based on sub-arbitrations, wherein an arbiter comprises a plurality of sub-arbiters and one sub-arbitration is a page hit and each other sub-arbitration is not a page hit.

34. The method of claim 25, wherein the refresh command is for a selected bank.

* * * * *